United States Patent [19]

Hayes et al.

[11] Patent Number: 4,642,569

[45] Date of Patent: Feb. 10, 1987

[54] SHIELD FOR DECOUPLING RF AND GRADIENT COILS IN AN NMR APPARATUS

[75] Inventors: Cecil E. Hayes, Wauwatosa; Matthew G. Eash, Oconomowoc, both of Wis.

[73] Assignee: General Electric Company, Milwaukee, Wis.

[21] Appl. No.: 562,121

[22] Filed: Dec. 16, 1983

[51] Int. Cl.[4] ............................................. G01R 33/20
[52] U.S. Cl. ..................... 324/318; 324/300
[58] Field of Search ............... 324/300, 318, 319, 320, 324/321, 322; 335/214, 301, 213, 299; 336/84 C, 84 R

[56] References Cited

U.S. PATENT DOCUMENTS

| | | | |
|---|---|---|---|
| 3,409,805 | 11/1968 | Whipple | 336/84 C |
| 3,569,823 | 3/1971 | Golay | 324/320 |
| 4,310,799 | 1/1982 | Hutchison | 324/319 |
| 4,490,675 | 12/1984 | Knuettel | 324/318 |
| 4,506,224 | 3/1985 | Krause | 324/318 |

FOREIGN PATENT DOCUMENTS

| | | | |
|---|---|---|---|
| 0067933 | 12/1982 | European Pat. Off. | 324/318 |
| 0073375 | 3/1983 | European Pat. Off. | 324/318 |
| 1901793 | 6/1972 | Fed. Rep. of Germany | 324/319 |
| 2942020 | 5/1980 | Fed. Rep. of Germany | 324/319 |
| 1190411 | 5/1970 | United Kingdom | 335/214 |

*Primary Examiner*—Michael J. Tokar
*Assistant Examiner*—Scott M. Oldham
*Attorney, Agent, or Firm*—Alexander M. Gerasimow; Douglas E. Stoner

[57] ABSTRACT

A shield for decoupling radio frequency (RF) and magnetic field gradient coils in an NMR apparatus is made up of first and second arrays of electrically conductive regions separated from one another by relatively narrow non-conductive regions. The arrays are disposed on opposite surfaces of a member formed of a high dielectric material. The conductive regions of one array are offset relative to the conductive regions of the other array such that the conductive regions of the one array bridge the non-conductive regions of the other array to form a plurality of capacitive elements. In operation, the capacitive elements act essentially as electrical short-circuits at radio frequencies, but transmit substantially unaffected the homogeneous magnetic field and audio frequencies associated with pulsed magnetic field gradients.

7 Claims, 8 Drawing Figures

SHIELD FOR DECOUPLING RF AND GRADIENT COILS IN AN NMR APPARATUS

BACKGROUND OF THE INVENTION

This invention relates to nuclear magnetic resonance (NMR) apparatus. More specifically, the invention relates to decoupling shields particularly useful in an NMR apparatus for decoupling radio-frequency (RF) and gradient coils.

In general, the NMR apparatus includes a main magnet typically configured as a solenoid having a bore formed therein for accepting the NMR sample to be studied. The magnet which is frequently of a resistive or superconductive design is used to produce a homogeneous polarizing magnetic field in a predetermined region within the bore. The magnetic field is needed to polarize the nuclei within the sample, so that the NMR phenomenon can be excited. Magnetic fields utilized in NMR imaging and particularly those needed for in-vivo spectroscopy must be highly homogeneous to, for example, in excess of one part in a million. To achieve such degree of homogeneity, auxiliary field-correcting coils referred to as shim coils are provided in the magnet bore to provide the necessary correction factors. Radio-frequency coils constructed on cylindrical forms are positioned within the magnet bore coaxially with the longitudinal bore axis. The RF coils are used to irradiate the sample studied to excite the nuclear spins. Upon cessation of the RF excitation, the excited nuclei radiate an NMR signal which is detected with the same coil used to excite the resonance or with a separate coil orthogonally oriented with respect to the excitation coil. Additionally, in an NMR imaging apparatus three sets of gradient coils are provided within the bore. The gradient coils when energized are capable of producing three orthogonal, substantially linear magnetic field gradients each oriented along one of the directions of a conventional Cartesian coordinate system. The gradients are utilized in a well-known manner to encode into NMR signal spatial information of the nuclear spin distribution within the sample region excited by the RF coils. This information can be used to reconstruct images displaying one or more NMR parameters.

Bore space in NMR magnets utilizied in whole-body NMR imaging is limited due to the fact that sufficient clearance must be provided to accommodate the human torso. The RF, gradient, and/or magnet shim coils are therefore situated in close proximity to one another. In a typical configuration, the RF coils are placed coaxially within the gradient coils. There can be numerous interactions between various coils which can degrade the performance of the RF coils. The gradient coils or shim can cause losses to occur in the RF coils. These losses can lower the quality factor Q of the RF coil resulting in a lower signal-to-noise ratio in the image. Although the signal-to-noise ratio can be improved by signal averaging, this is not a desirable solution since the NMR data collection time is unacceptably increased. The numerous windings within the gradient coils are coupled together by stray capacitances which can give rise to a plurality of spurious resonances when the RF coils are energized. If one or more of these spurious resonances interacts with the RF coil, the desired RF frequency may be displaced and the desired resonance damped. These detrimental effects increase with the proximity of the RF coils to the gradient coils.

The interaction between the RF and gradient coils can be reduced or eliminated by placing an RF opaque screen between the gradient and RF coil forms. The screen must be several RF skin-depths thick to decouple the coils effectively. Suitable screens have been fashioned from copper mesh screen or copper foil having a thickness of .004 inches with a fiber backing. Such screens have been found effective in destroying RF interaction between the RF and gradient coils. A drawback associated with such simple shields is that the high-frequency response of the gradient coils is degraded. The rise time of the switched gradient field is lengthened by the eddy current induced in the continuous conductive layer of the RF shield.

It is, therefore, an object of the invention to provide an RF shield for effectively decoupling the RF and gradient coils without significantly degrading coil performance.

It is another object of the invention to provide an RF shield which acts as a low-pass filter for the time-dependent magnetic fields produced by the gradient coils.

It is a further object of the invention to provide an RF shield which is substantially transparent to homogeneous magnetic field and audio frequency gradient magnetic fields but which is highly reflective with low loss for RF magnetic fields.

SUMMARY OF THE INVENTION

An NMR apparatus includes means for producing a homogeneous magnetic field, a radio-frequency (RF) coil for transmitting and receiving RF energy, and gradient coils for generating pulsed linear magnetic field gradients at audio frequencies. A decoupling shield disposed between the RF and gradient coils is made up of first and second arrays of electrically conductive regions separated by relatively narrow non-conductive regions. The arrays are disposed on opposite surfaces of a member formed of a high dielectric material, and are offset relative to one another such that the conductive regions of the one array bridge the non-conductive regions of the other array to form a plurality of capacitive elements. In operation, the capacitive elements act essentially as electrical short circuits at radio frequencies and transmit substantially unaffected the homogeneous magnetic field and audio frequencies associated with the pulsed magnetic field gradients.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1:
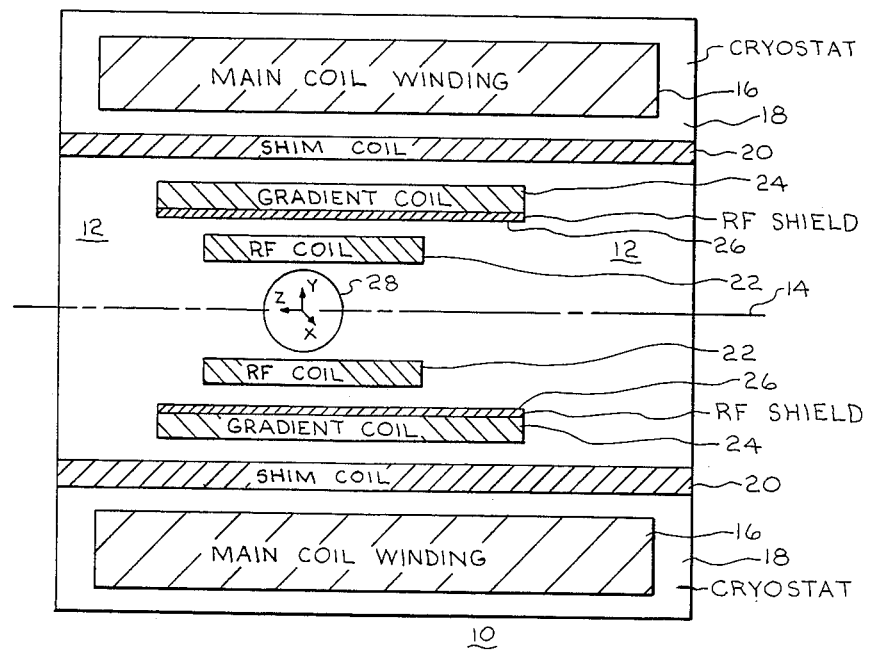
FIG. 1 is a cross-sectional view of an NMR magnet depicting RF, gradient, and shim coil assemblies, including an RF shield.

FIG. 1 depicts a side cross-sectional view of a superconductive NMR magnet generally designated 10. The magnet is of a solenoidal construction having a cylindrical bore 12 centered about a longitudinal axis 14. The magnet is provided with a set of main coil windings 16 which when energized produced the polarizing magnetic field. In the superconductive magnet the main coils are disposed within a cryostat 18 containing suitable cryogens, such as liquid helium and nitrogen for maintaining the coil windings at superconductive temperatures characteristic of the materials used in the coils. One or more sets of shim coils 20 which may be of resistive or superconductive design are typically provided to correct for magnetic field inhomogeneities inherent in the main coil windings. Superconductive shim coils would, of course, be housed within cryostat 18. Shim coils of resistive or superconductive design are advantageously placed adjacent to the main coil windings. An RF coil assembly 22 is positioned coaxially inside a gradient coil assembly 24. An RF decoupling shield 26 is positioned coaxially between the RF and gradient coil assemblies. A region of the patient (not shown) to be examined is aligned with a generally spherical volume 28 where the polarizing and RF magnetic fields are homogeneous and where the gradient magnetic field produced by the gradient coil assemblies are linear.

One embodiment of a decoupling RF shield in accordance with the invention will now be described with reference to FIG. 2. The shield is made up of two sheets 32 and 34 of a conductive material, such as copper, separated by a thin layer 36 of a low-loss flexible dielectric material such as Teflon synthetic resin polymer or polyethelene thermo-plastic polymer. In the preferred embodiment of the invention, the shield is constucted utilizing a double-sided copper-clad Teflon resin printed circuit board. Each of copper layers 32 and 34 is divided into an array of square of square or rectangular conductive areas (such as shaded areas designated 38) by etching (suing conventional techniques) mutually perpendicular non-conductive gaps such as those designated in FIG. 2 by orthogonal lines 40 and 42. The pattern (depicted by dashed lines) on copper sheet 34 is offset with respect to the pattern (depicted by solid lines) on sheet 32 by one half the width of rectangular areas 38. The size of each array element 38 is made sufficiently small to minimize the eddy current effects at audio frequencies induced by the pulsed magnetic field gradients. At radio frequencies, the gaps formed by etched lines 40 and 42 on one sheet are electrically bridged by continuous portions of the copper sheet on the other side of the dielectric. The thickness of dielectric material 36 is preferably selected to be very small, typically of the order of 0.004–0.008 in., so as to create a large capacitance between the copper layers. In this manner, the gaps in conductivity on one copper sheet are capacitively shorted by conductors on the other side. At radio frequencies, the shield appears to be a single continuous conductor which is opaque to RF magnetic fields. The effect of the capacitive coupling is negligible at audio frequencies associated with the magnetic-field gradient pulses. An RF decoupling shield for use in an NMR apparatus is formed by shaping the flat printed circuit board into a cylindrical tube which is sized to fit against the gradient coil assembly. The cylinder is configured such that sheet 32 comprises the inner cylindrical shield surface. To this end, edge A—A is joined to edge B—B of sheet 32 to form electrically conductive joints between the half-size conductive areas (e.g., 44a to 44b, 46a to 46b, and 48b to 48b, etc.) In the completed shield, edges A—A and B—B of sheet 34 remain unconnected to form a gap.

Figure 2:
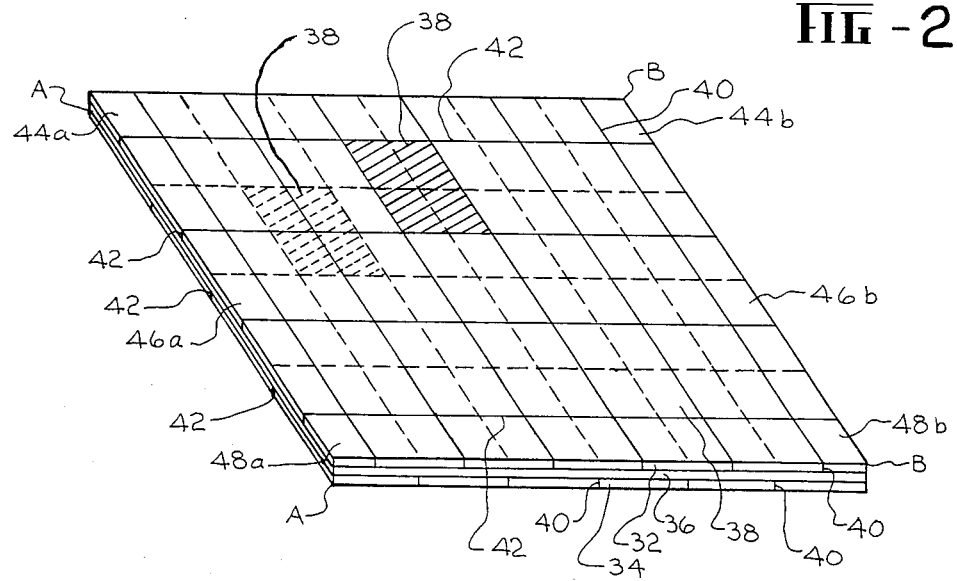
FIGS. 2 and 3 depict exemplary embodiments of an RF shield in accordance with the invention.
Figure 3:
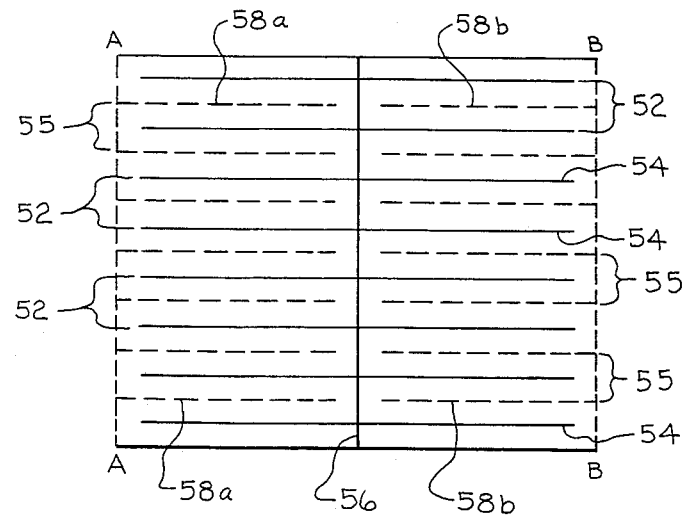

It will be recognized that, although the invention has been described with reference to FIG. 2 depicting a rectangular grid pattern, there are other patterns which can be fashioned to provide the capacitive elements. One example of such an alternative pattern to be utilized with the inventive RF shield is depicted in FIG. 3. The pattern is a modification of the pattern described with reference to FIG. 2. In this case, the inner conductive sheet (i.e., the sheet comprising the inner cylindrical shield surface) is subdivided into a plurality of conductive strips such as those designated 52 by etched lines 54 depicted in FIG. 3 by the solid lines. A pattern is etched on the outer conductive sheet to form strips 55 as indicated by dashed lines 58a and 58b which stop short of solid etch line 56 to avoid cross-over regions which can cause RF field leakage to occur. As before, the two conductive sheets are separated by a thin dielectric material and the patterns are offset relative to one another such that the etched areas on one are bridged by conductive areas on the other so as to form capacitive elements which act as short circuits to RF currents. This embodiment is particularly useful with an RF coil of solenoidal construction in which the coil turns (hence, current flow) would be parallel to etched lines 54, 58a, and 58b. As before, the shield is formed into a cylinder by joining edge A—A to edge B—B and soldering the two halves of the inner conductive surface. In the completed shield, edges A—A and B—B of the outer conductive sheet remain electrically unconnected to form a gap as suggested in FIG. 3 by dashed lines along edges A—A and B—B. Etched line 56 perpendicular to etched lines 54 prevents circumferential eddy currents (induced by pulsed magnetic field gradients) in strips 52 when the shield is formed into a cylinder.

The RF decoupling shield described hereinabove with reference to FIGS. 2 and 3 performs adequately. RF shields having improved performance, however, may be constructed if the current flow induced in the shield by the magnetic field generated by the RF coil is considered. The RF magnetic field is deflected by the currents induced in the shield surface closest to the RF coil (referred to as the inner shield surface). The currents induced in the shield are proportional and perpendicular to the tangential components of the RF magnetic field. When the RF coil is positioned near the RF shield as is the case in typical design, the current distribution in the inner shield surface essentially replicates the current in the coil elements. Etched (non-conductive) areas in the inner surface of the shield which run parallel to the direction of current flow in the coil elements will have minimal adverse effect on the performance of the shield. It is desirable, therefore, that the pattern of etched lines on the inner surface of the shield be tailored to match the particular RF coil geometry employed. Generally, it is necessary to etch areas so as to provide matching conductive strips on the inner shield surface which are parallel to and centered on each of the conductors in the RF coil structure. The manner in which this is accomplished will be described hereinafter with respect to a particular coil configuration disclosed and claimed in Application Ser. No. 548,745, filed in the name of the same inventor as herein and which is incorporated herein by reference.

Some of the etched lines in the inner shield surface must be made perpendicular to the direction of the currents induced by the RF coil in order to eliminate large gradient-induced eddy current loops. The etched lines should be fabricated where the surface current density is smallest. Advantageously, the lines may be etched at places on the shield where surface current is zero or negligible due to the symmetry of the RF coil which results in some of the coil conductors not carrying any appreciable currents.

Figure 4:
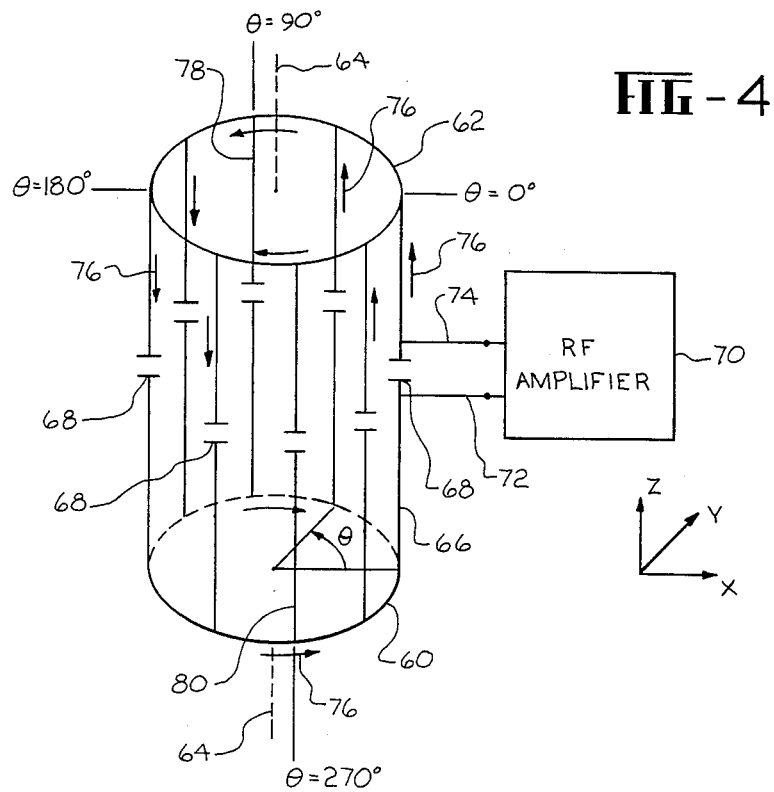
FIG. 4 depicts schematically an RF coil particularly useful in NMR studies and with respect to which a preferred embodiment of the RF shield will be disclosed.

Another embodiment of the invention will now be disclosed with reference to FIG. 4 which depicts one embodiment of an RF coil useful in performing NMR studies. The coil is claimed and disclosed in greater detail in the afore-identified patent application. Briefly, the coil is made up of two conductive loop elements 60 and 62 spaced apart along a common longitudinal axis 64. The conductive loop elements are electrically interconnected by a plurality of conductors (such as the one designated 66) each having a reactive element 68, preferably a capacitor, connected in series therewith. The coil embodiment depicted in FIG. 4 is shown as having eight conductors. In practice, the number of conductors may be varied and embodiments having as many as thirty-two such conductors have been fabricated. The conductors are separated along the peipheries of loop elements 60 and 62 by an angle $\theta$ measured from, for example, the X axis. The preferred embodiment of the coil is constructed using flexible printed circuit board materials which are etched to provide the needed conductive paths. Advantageously, double-sided printed circuit boards may be utilized. Capacitors 68 are formed in a manner similar to that previously described with reference to FIG. 2 by etching gaps in a conductor 68 on one side of the printed circuit board such that the etched portion is overlapped by a continuous conductive portion on the other side of the printed circuit. The coil is energized by means of an RF amplifier 70 shown in block diagram form across a capacitor 68 by means of coil input leads 72 and 74. In operation, the current distribution in conductor 68 is generally sinusoidal and dependent on the angular position $\theta$ of the conductor along the loop periphery. The current distribution in the coil is indicated in FIG. 4 by means of arrows 76. It will be noted that two diametrically opposed conductors 78 and 80 carry substantially no current.

Figures 5A, 5B:
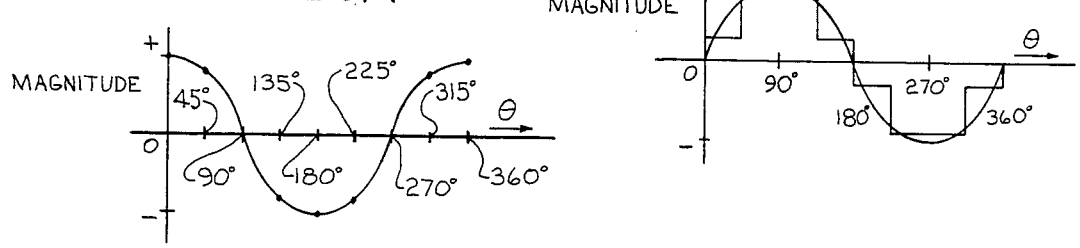
FIGS. 5A and 5B depict graphically the current distributions in the coil shown in FIG. 4.

Current distribution in the RF coil described with reference to FIG. 4 will not be discussed with reference to FIGS. 5A and 5B which depict graphically the current distribution in conductors 66 and in conductive loop elements 60 and 62, respectively. Referring first to FIG. 5A, it will be noted that the current distribution in conductors 66 is substantially sinusoidal with maximum current magnitudes (indicated along the vertical axis) occurring at angles of $\theta=0°$ and $180°$ as indicated along the horizontal axis. Current minima occur at conductors 78 and 80 positioned at angles of 90° and 270°. Referring now to FIG. 5B, it will be seen that maximum loop currents occur at points along the loop periphery displaced by 90° on either side of the conductor 66 at which the coil is energized. In this case, it will seen that maximum currents occur at angles of $\theta=90°$ and 270°, while current minima occur at an angles of 0° and 180°.

Figure 6:
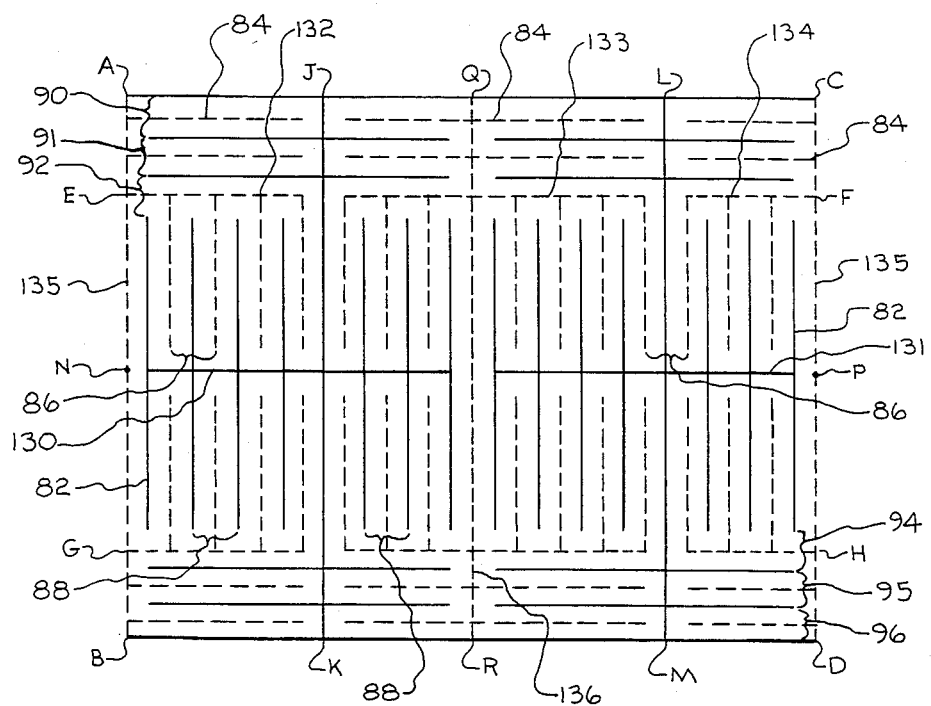
FIG. 6 depicts a preferred embodiment of the inventive RF shield useful with the RF coil depicted in FIG. 4.

One embodiment of a decoupling shield useful with the RF coil described with reference to FIG. 4 is depicted in FIG. 6. FIG. 6 depicts the etched pattern to be used on the two conductive surfaces separated by the dielectric material. Solid lines 82 designate the areas to be etched on the inner conducting sheet, (i.e., the conducting sheet which will form the inner cylindrical surface), while dotted lines 84 designate the areas to be etched in the outer conducting sheet. The etched printed circuit board can be formed into a cylinder suitable for positioning within the magnet bore by soldering edges A-B and C-D of the inner conducting sheet. As before, the edges of the outer conductive sheet are not electrically connected and form a gap as suggested by dashed lines 135 connecting points A-B and C-D. The inner and outer conductive sheets in a central rectangular region defined by letters E, F, G, and H of the decoupling shield are etched to create a plurality of vertical strips 88 and 86, respectively, which parallel the straight conductor element 66 (FIG. 4) on the cylindrical surface of the RF coil. The etched lines on each of inner and outer conducting surfaces are displaced relative to one another by half of the strip width, for example, such that a gap on one conductive sheet is bridged by the co-extensively situated conductive strip on the other conductive sheet. Conductive strips 90, 91, and 92 on the inner conductive sheet and conductive strips 94, 95, and 96 conduct currents corresponding to those flowing in the conductive loop elements 60 and 62 of the RF coil. Conductive loop element 60 is centered on strip 92, while conductive loop element 62 is centered on strip 94. There are no discontinuities in these paths because the etched areas located along lines J-K and L-M can be positioned at points along the loop peipheries where the loop currents are at a minimum. As described hereinbefore, such points occur at angular positions $\theta=0°$ and 180° (FIG. 5B). Etched lines 130 and 131 do impede vertical current flow. These cuts are necessary, however, to prevent gradient-induced eddy currents. In this area of the coil, however, the coil current is spread out over a wide area so that current densities are lower across lines 130 and 131 than in strips 92 and 94. Additionally, larger areas of capacitive coupling bridge lines 130 and 131. Etched lines 132, 133, and 134 on the outer conductive sheet are located far from the corresponding etched lines 130 and 131 on the inner conductive sheet to maximize the capacitive bridging across lines 130 and 131. Etched lines 135 and 136 form a gap in the completed shield and on the outer conductive sheet prevent gradient-induced eddy current loops in the outer conductive sheet without producing any adverse effects on shield efficacy. It should be noted that none of the etched lines in the inner conducting sheet cross those on the outer conducting sheet. However, it may be desirable to permit such cross-overs as, for example, by joining lines 130 and 131 to form a single continuous etched line between points N and P. In this case, all vertical conductive elements such as those designated 88 will offer substantially the same impedance to currents induced on the inner surface. Unbalanced or unequal impedances in the inner shield surface could induce peturbations in the RF coil current distribution which would reduce the homogeneity of the RF field.

Leaks in the decoupling shield will occur if an etched line in the inner conducting sheet crosses an etched line on the outer conductive sheet. At the intersection of the etched lines, there will be a small area with no conductive material. Such leaks can be eliminated by adding a second dielectric sheet (not shown) and a third conductive region (not shown) overlaying the intersection of the etched lines. The third conductive region may be, for example, 4×4 inches and centered on the intersecton. It is possible to avoid crossing of the etched lines by judicious choice of the patterns of the two conductive sheets as depicted in FIGS. 3 and 6.

In one embodiment of the inventive decoupling shield fabricated to operate at 64 mHz corresponding to the proton resonant frequency in a 1.5 Tesla magnetic field, it was found that one-ounce copper material for each of the inner and outer conductor sheets is adequate to contain the RF currents. It has been found additionally that printed circuit boards utilizing Teflon resin as the dielectric material between the two conductive sheets are preferred to minimize the loading of the RF coil.

Figure 7:
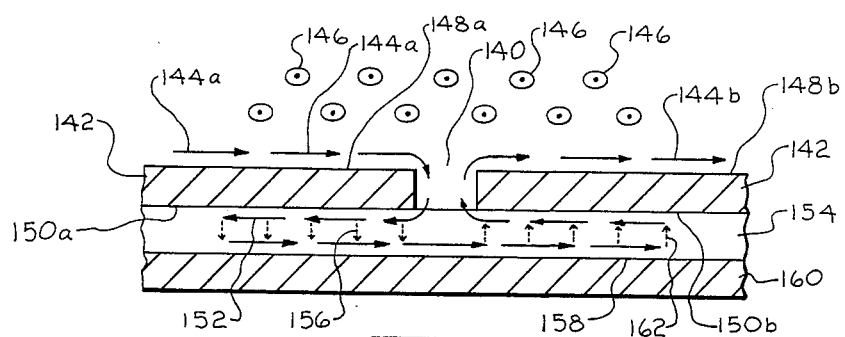
FIG. 7 depicts a sectional side view of a cut in the inner shield surface transverse to current flow with reference to which shield operation is described.

The manner in which current flows across the etched lines in the shield will now be described with reference to FIG. 7 which depicts a side view of an etched line 140 in an inner conductive sheet 142. The etched line is formed transverse to the direction of current flow in the inner conducting sheet designated by arrows 144a. The RF magnetic field produced by the RF coil, directed pependicular to and outward from the plane of the figure, is indicated by dotted circles 146. When the current on the inner surface 148a of conductive sheet 142 reaches etched line 140, it is deflected to the opposite side 150a of the inner conductive sheet and flows away from the etched line as indicated by arrows 152 directed in an opposite direction of arrows 144a. The current passes through a dielectric material designated 154 as a displacement current indicated by dashed arrows 156. The current bridges etched line 140 by flowing along a surface 158 of the outer conducted sheet 160 adjacent to the dielectric material. The current re-crosses the dielectric material as indicated by dashed arrows 162 and then flows on surface 150b of inner conductive sheet 142 toward edge line 140 and out to the surface 148b (as indicated by arrows 144b) of the inner conductive sheet as required by tangential magnetic field represented by the dotted circles 146. To minimize the voltages developed across etched line 140, the capacitance between the inner and outer conductive sheets should be large. This requires that dielectric material 154 be thin and that the etched lines on the outer conductive sheet 160 should be spaced far from the cut (such as cut 140) in the inner conductive sheet so as to provide a maximum area of overlap on either side of the etched line.

It will be appreciated from the foregoing that in accordance with the invention there is provided an RF shield for decoupling RF and gradient coils without significantly degrading the performance of either coil. The shield is substantially transparent to the homogeneous magnetic field and audio frequency magnetic field gradients. In operation, the shield acts as a low-pass filter for time-dependent gradient magnetic fields and as an electrical short-circuit for RF fields.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

What is claimed:

1. An NMR apparatus including means for producing a homogeneous magnetic field, a radio frequency (RF) coil for transmitting and receiving RF energy, a gradient coil for generating pulsed linear magnetic field gradients at audio frequencies and a decoupling shield disposed between said RF and gradient coils, said RF coil being disposed within the shield, said shield comprising:

a first array made up of a multiplicity of electrically conductive regions separated by a first set of relatively narrow, compared to the width of said conductive regions, non-conductive regions, said array being disposed on the inner shield surface;

a second array made up of a multiplicity of electrically conductive regions separated by a second set of relatively narrow, compared to the width of said conductive regions, non-conductive regions, said first and second arrays being disposed on opposite surfaces of a member formed of a high dielectric material, the conductive regions of one array being offset relative to the conductive regions of the other array such that the conductive regions of the one array bridge the non-conductive regions of the other array to form a plurality of capacitive elements which act essentially as electrical short-circuits at radio frequencies and which transmit substantially unaffected the homogeneous magnetic field and the audio frequencies associated with the pulsed magnetic field gradients.

2. The NMR apparatus of claim 1 wherein said first set of non-conductive regions situated on the inner shield surface are oriented substantially parallel to the direction of current flow induced in the shield by RF coil elements adjacent to the inner shield surface when said RF coil is energized.

3. The NMR apparatus of claim 1 wherein predetermined ones of the conductive regions forming said first array are parallel to and centered on the adjacent RF coil element.

4. The NMR apparatus of claim 1 wherein said first and second arrays comprise conductive areas on opposite sides of a single, double-sided printed circuit board.

5. The NMR apparatus of claim 1 wherein said first and second sets of non-conductive regions are oriented relative to one another so as to avoid regions of cross-over therebetween to thereby avoid areas in the shield through which RF energy can pass.

6. The NMR apparatus of claim 1 wherein predetermined ones of said first set of non-conductive regions separate predetermined ones of said conductive regions in said first array such that said predetermined conductive regions and the capacitive reactance imposed by the non-conductive regions offer substantially the same impedance to currents induced therein when said RF coil is energized.

7. The NMR apparatus of claim 1 further comprising an additional planar member formed of a high dielectric material having a third array of electrically conductive regions, which regions overlay cross-over points if any in said first and second sets of non-conductive regions.

* * * * *

UNITED STATES PATENT AND TRADEMARK OFFICE
CERTIFICATE OF CORRECTION

PATENT NO. : 4,642,569
DATED : February 10, 1987
INVENTOR(S) : Cecil E. Hayes and Matthew G. Eash It is certified that error appears in the above-identified patent and that said Letters Patent is hereby corrected as shown below:

Col. 1, line 55, after "shim" insert --coils--.
Col. 3, line 47, delete "of square", second occurrence; and
         line 49, change "suing" to --using--.
Col. 5, line 56 change "not" to --now--.

Signed and Sealed this

Twenty-fourth Day of May, 1988

Attest:

DONALD J. QUIGG

Attesting Officer

Commissioner of Patents and Trademarks